United States Patent [19]

Hayashi et al.

[11] Patent Number: 5,627,141
[45] Date of Patent: May 6, 1997

[54] METHOD OF PRODUCING CERAMICS SYSTEM SUPERCONDUCTING WIRE

[75] Inventors: Kazuhiko Hayashi; Hisao Nonoyama, both of Osaka, Japan

[73] Assignee: Sumitomo Electric Industries, Ltd., Japan

[21] Appl. No.: 446,347

[22] Filed: May 22, 1995

Related U.S. Application Data

[63] Continuation of Ser. No. 78,806, Jun. 17, 1993, abandoned, which is a continuation of Ser. No. 932,998, Aug. 20, 1992, abandoned, which is a continuation of Ser. No. 598,702, Sep. 13, 1990, abandoned.

[30] Foreign Application Priority Data

Jan. 14, 1989 [JP] Japan .......................................... 1-6638

[51] Int. Cl.$^6$ .................................................. H01L 39/24
[52] U.S. Cl. .......................... 505/433; 29/599; 505/451; 505/492; 505/501; 505/740; 505/742
[58] Field of Search ...................................... 505/400, 430, 505/432, 433, 451, 450, 492, 500, 501, 740, 742; 29/599

[56] References Cited

U.S. PATENT DOCUMENTS

| 4,885,273 | 12/1989 | Sugimoto et al. | 505/1 |
|---|---|---|---|
| 4,906,609 | 3/1990 | Yamauchi et al. | 505/1 |
| 4,952,554 | 8/1990 | Jin et al. | 29/599 X |
| 4,980,964 | 1/1991 | Boeke | 29/599 |
| 5,100,865 | 3/1992 | Yamamoto et al. | 29/599 X |
| 5,106,825 | 4/1992 | Mandigo et al. | 29/599 X |
| 5,157,017 | 10/1992 | Jin et al. | 505/451 |

FOREIGN PATENT DOCUMENTS

| 0281474 | 9/1988 | European Pat. Off. . |
|---|---|---|
| 0282286 | 9/1988 | European Pat. Off. . |
| A281474 | 9/1988 | European Pat. Off. . |
| 0281444 | 9/1988 | European Pat. Off. . |
| 0288709 | 11/1988 | European Pat. Off. . |
| 0295023 | 12/1988 | European Pat. Off. . |
| 0297707 | 1/1989 | European Pat. Off. . |
| 0304076 | 2/1989 | European Pat. Off. . |
| A304076 | 2/1989 | European Pat. Off. . |
| A331360 | 9/1989 | European Pat. Off. . |
| 63-285812 | 11/1988 | Japan . |

OTHER PUBLICATIONS

"Aligned Sintered Compacts of $RBq_2Cu_3O_{7-+}(R=Dy, Er, Eu, Cd, Ho,Y)$", Arendt et al., 1987.

Kohno et al., "Characteristics of High $T_c$ Oxide Wire", Physica, vol. 148 B+C, nos. 1–3, Dec. 1987, pp. 429–431.

"Superconductors' Critical Current at a New High", Science, vol. 238, Dec. 18, 1987, pp. 1655–1656.

Arendt et al., "Aligned Sintered Compacts of $RBa_2Cu_3O_{7-+}$ (R–Dy, Er, Eu, Gd, Ho, Y)", Materials Research Society Symposium Proceedings, Brodsky et al., eds., vol. 99, 1988, pp. 203–208, during the symposium held on Nov. 30–Dec. 4, 1987, in Boston, MA, USA.

Nagata et al., "Development of High Tc Superconducting Wire by Powder Method", Advances In Superconductivity, during the first International Symposium on Superconductivity (ISS '88), held on Aug. 28–31, 1988, in Nagoya, Japan.

(List continued on next page.)

*Primary Examiner*—Joseph M. Gorski
*Attorney, Agent, or Firm*—Pennie & Edmonds

[57] ABSTRACT

In order to obtain a ceramics system superconducting wire, a bulk type ceramics system superconductor or its precursor previously treated to have orientativity in its crystal structure is reduced in diameter in a state charged in a metallic pipe, thereby being elongated, and then heat treated. In the as-formed superconducting wire, crystal orientativity of a bulk formed of the superconductor or its precursor is maintained, whereby it is possible to obtain a superconducting wire having high critical current density. In order to further improve the critical current density, it is effective that the diameter reduction working step and the heat treatment step are alternately repeated a plurality of times.

9 Claims, 1 Drawing Sheet

OTHER PUBLICATIONS

H. Mukai et al., "Fabrication of high Tc superconducting tape by solid reaction method", Proceedings Of Int. Symposium On New Developments In Applied Superconductivity 17 Oct. 1988, Osaka, JP, pp. 101–106.

H. Sekine et al., "Studies on the non rare earth oxide superconductors fabricated by sintering", IEEE Transactions On Magnetics, vol. 25, No. 2, Mar. 1989, San Francisco, US, pp. 2164–2167.

METHOD OF PRODUCING CERAMICS SYSTEM SUPERCONDUCTING WIRE

This application is a continuation of application Ser. No. 08/078,806, filed on Jun. 17, 1993, and now abandoned, which is a continuation of application Ser. No. 07/932,998, filed on Aug. 20, 1992, and now abandoned, which in turn is a continuation of application Ser. No. 07/598,702, filed on Sep. 13, 1990, and now abandoned.

TECHNICAL FIELD

The present invention relates to a method of producing a superconducting wire which is provided with superconductivity by a ceramics system superconductive material, and more particularly, it relates to a method of producing a superconducting wire which is used for manufacturing a superconducting coil, a superconducting power cable or the like, for example.

BACKGROUND ART

Under a superconducting phenomenon, a material exhibits complete demagnetization such that it develops no electric potential difference, i.e., its electrical resistance is reduced to zero although a finite stationary current flows in its interior. Accordingly, various applications of a superconductor have been proposed with respect to a transmission medium, an element or a device having absolutely no power loss.

Namely, a lot of fields of utilization, such as the electric power field of MHD power generation, power transmission, power storage and the like; the power field of a magnetic levitation train, an electromagnetic thruster equipment, and the like; and, further, supersensitive sensors for magnetic fields, microwaves and radioactive rays employed in the field of measurement of NMR, a π-meson remedy apparatus, an experimentation apparatus for high energy physic and the like, can be listed as fields of applications of a superconductive material. Also in the field of electronics, it is expected as a technique which can implement a very high speed element of lower electric power consumption represented by a Josephson device.

On the other hand, as a superconductive oxide having a critical temperature Tc which is extremely higher than those of conventional metal system superconductive materials was discovered by Bednorz and Müller etc. in 1986, a possibility for high temperature superconduction has been greatly developed (Z. Phys. B64, 1986, September, pp. 189–193). A composite oxide system superconductive material discovered by Bednorz and Müller etc. has composition of $[La, Ba]_2CuO_4$ or $[La, Sr]_2CuO_4$, and is regarded as having a $K_2NiF_4$ type crystal structure. While these materials are similar in crystal structure to generally known perovskite type composite oxide superconductive materials, their Tc, which are 30 to 50K, are extremely high as compared with the conventional superconductive materials. As to the generally known composite oxide system superconductive materials, a Ba—Pb—Bi system composite oxide disclosed in U.S. Pat. No. 3,932,315, and a Ba—Bi system composite oxide disclosed in Japanese Patent Laying-Open Gazette No. 60-173885 may be listed. However, Tc of these composite oxides are not more than 10K, and it has been indispensable to employ liquid helium (boiling point: 4.2K) for utilizing the same as superconductive materials.

The aforementioned $[La, Ba]_2CuO_4$ and the like, for example, include oxides of group IIa elements and group IIIa elements, and sintered bodies containing such oxides, which are regarded as having crystal structures similar to perovskite type oxides and may be called pseudo-perovskite type structures, can be divided broadly into a $K_2NiF_4$ type oxide such as $[La, Ba]_2CuO_4$ or $[La, Sr]_2CuO_4$ etc., an orthorhombic type oxide of a $Ba_2YCu_3O$ system, and an oxide containing Bi—Sr—Ca—Cu. These materials exhibit superconducting phenomenons at Tc which are extremely high as compared with the aforementioned generally known superconductive materials, and hence liquid hydrogen (boiling point: 20.4K), liquid neon (boiling point: 27.3K) or liquid nitrogen (boiling point: 77.3K) can be used as a cooling medium. Accordingly, expected are applications of these recently discovered composite oxide system superconductive materials having perovskite structures to transmission media for power or electric signals.

In general, products of oxides have been mainly produced by powder sintering, in which the oxides are molded into desired configurations by performing sintering after press molding or HIP molding etc. Also with respect to the aforementioned new superconductive oxides, therefore, merely bulk type sintered bodies are produced by a powder sintering method under existing circumstances, and substantially no attempts have been made in order to apply these oxides to practical electric transmission media, particularly as linear products.

To this end, the applicant has proposed a method of producing a superconducting elongated body comprising the steps of charging ceramics raw material powder composed of a composite oxide having a superconducting property in a metallic pipe, carrying out plastic deformation working for reducing the sectional area of the aforementioned metallic pipe in the state charged with the ceramic raw material powder, and heat treating the aforementioned metallic pipe after the plastic deformation, thereby sintering the aforementioned ceramic raw material powder charged in the aforementioned metallic pipe in Japanese Patent Application No. 63-025108 filed on Feb. 5, 1988 and entitled "Method of Producing Composite Oxide Ceramics System Superconducting Wire".

Although this method is a satisfactory method itself, skill is required for charging the raw material in the metallic pipe with sufficiently large bulk density since the raw material is charged in the metallic pipe in the form of powder, and hence it has been difficult to improve critical current density Jc if the state of charging is inferior.

According to the aforementioned method, further, the ceramic raw material powder is sintered in the metallic pipe, while it is difficult to control the crystal structure of a target superconductive material in this stage, and it is also difficult to thereafter provide appropriate orientativity to the crystal texture of the superconductive material existing in the metallic pipe. Also in such meaning, therefore, it has been impossible to expect high Jc for a superconductive material obtained by the aforementioned method using sintering.

In a method of charging powder in a similar metallic pipe and working the same into a wire, further, there is means for making orientation by stress through pressing or rolling, while it has been difficult to improve Jc in a thick film state if tape thickness is large, since the effect of the stress merely ranges over a limited thickness.

Accordingly, an object of the present invention is to provide a method of producing a superconducting wire rod having high critical current density Jc, which is provided with superconductivity by a ceramics system superconductive material.

DISCLOSURE OF THE INVENTION

The present invention is characterized in that a bulk type ceramics system superconductor or its precursor previously treated to have orientativity in its crystal texture is employed. This superconductor or its precursor is charged in a metallic pipe. Then, the superconductor or its precursor is reduced in diameter in the state charged in the metallic pipe, thereby being elongated. After such a diameter reduction working step, the superconductor or its precursor is heat treated.

The bulk type ceramics charged in the metallic pipe may not have a superconducting property but may have a semiconductoring property, for example, at the time of charging. The bulk type ceramics may be provided with a superconducting property through later heat treatment, and the expression "superconductor or its precursor" is used for this reason.

A bulk type ceramics system superconductor or its precursor having orientativity can be produced by a method including a melting and solidifying step, which is represented by a unidirectional solidifying method such as a floating zone melting method, for example, sintering in magnetic field or the like.

The metallic pipe is preferably formed of silver or a silver alloy. When the silver alloy is employed, further, this is preferably an Ag—3 to 30 wt. % Pd alloy.

A material for forming the employed ceramics system superconductor or its precursor is prepared from a Bi—Sr—Ca—Cu—O system oxide, a Bi—Pb—Sr—Ca—Cu—O system oxide or the like, for example. Preferably a diameter reduction working step and a heat treatment step are alternately repeated a plurality of times.

According to the present invention, a bulk type ceramics system superconductor or its precursor already having orientativity in its crystal texture is employed, to be charged in a metallic pipe and reduced in size, thereby being elongated. Therefore, the superconductor or its precursor provided in the metallic pipe maintains the state of having orientativity in its crystal structure to some extent also when the same is elongated. Heat treatment after the diameter reduction working is carried out in order to combine crystal grains again, junction between which has been rendered insufficient by the diameter reduction working, and the total orientation is not damaged throughout the steps included in the overall method according to the present invention. The optimum temperature for the heat treatment is varied with the target superconductor as well as the time, the atmosphere and the cooling rate of the heat treatment, while the treatment is preferably carried out at a temperature of at least 800° C. and not more than the melting point, in order to facilitate bonding and cause no deterioration in orientativity.

Thus, according to the present invention, a superconducting wire can be obtained in a state not damaging crystal orientativity of the initially prepared bulk type ceramics system superconductor or its precursor, whereby it is possible to obtain a superconducting wire having high critical current density Jc.

The longitudinal direction of the bulk type ceramics system superconductor or its precursor having orientativity is preferably oriented perpendicularly to the c-axes of the crystals. This is because a current most easily flows in the direction perpendicular to the c-axes.

Incidentally, it may be impossible to obtain a superconducting wire which allows considerably high critical current density merely through a single diameter reduction working step and a single heat treatment step. This is because crystal grains again combined by the heat treatment do not conform with the longitudinal direction of the wire in a strict sense, but tend to turn random directions to some extent. Therefore, it is effective to approach the directions of the crystal grains to the longitudinal direction of the wire by alternately repeating the diameter reduction working and the heat treatment a plurality of times. The frequency of such repetition is preferably up to five times at the most, since no effect can be attained if the frequency is too much.

The bulk type ceramics system superconductor or its precursor having orientativity in its crystal structure is prepared by a unidirectional solidifying method such as a floating zone melting method or a horizontal Bridgeman method, sintering in magnetic field, a hot pressing method or the like, while particularly a bulk obtained by the unidirectional solidifying method among these methods is dense and hardly causes voids through subsequent diameter reduction working.

If a pipe of silver or a silver alloy is employed as the metallic pipe, it hardly reacts with a material forming the ceramics system superconductor or its precursor, and particularly when a Y—Ba—Cu—O system material is employed as a material for forming the ceramics system superconductor or its precursor, it has an advantage of allowing smooth permeation of oxygen in final heat treatment. The silver or silver alloy pipe can also serve as a stabilizer after the same is worked into a wire, since it has low electric resistance and is excellent in heat transfer. When a silver alloy is employed in order to improve strength in diameter reduction working as well as to improve heat resistance in heat treatment, it is preferable to use palladium, which is completely solid soluted with silver for effectively increasing the melting point, as a metal for alloying silver. In this case, an Ag—3 to 30 wt. % Pd alloy is excellent in particular. This is because rates of increase in strength and melting point are small if addition of palladium is less than 3 percent by weight, while reaction between palladium and the material forming the ceramics system superconductor or its precursor easily takes place if it exceeds 30 percent by weight.

The material for forming the employed ceramics system superconductor or its precursor may be any substance including a known one. However, a Bi—Sr—Ca—Cu—O system material, which has a strong cleavage property and can be easily prepared by a unidirectional solidifying method, or a Bi—Pb—Sr—Ca—Cu—O system material, whose critical temperature Tc exceeds 100K, is particularly effective.

BEST MODE FOR CARRYING OUT THE INVENTION

Figure 1:
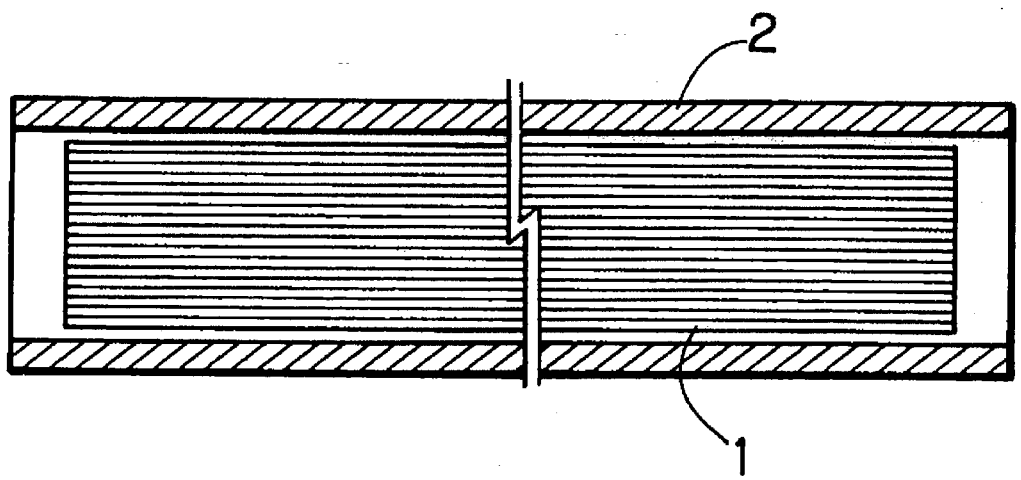
FIG. 1 is a sectional view showing such a state that a bulk type ceramics system superconductor or its precursor 1 obtained by carrying out steps included in an embodiment of the present invention is charged in a metallic pipe 2.
Figure 2:
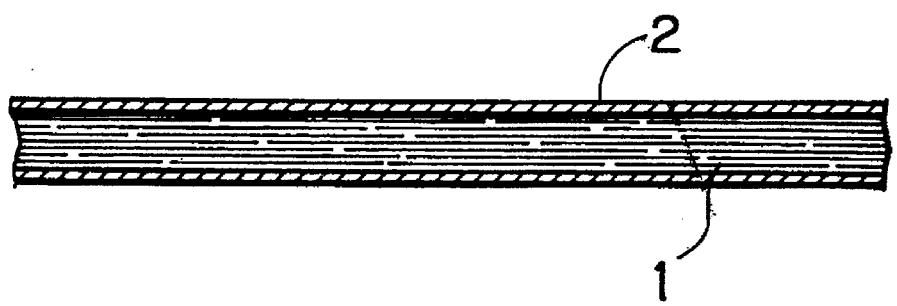
FIG. 2 is a sectional view showing such a state that the superconductor or its precursor 1 shown in FIG. 1 is reduced in diameter in the state charged in the metallic pipe 2.

With reference to FIGS. 1 and 2, an embodiment of the present invention is generally described.

As shown in FIG. 1, a bulk type ceramics system superconductor or its precursor 1 having crystal orientativity is prepared by a method as hereinabove described. This bulk type ceramics system superconductor or its precursor 1 is charged in a metallic pipe 2 which is formed of silver or a silver alloy, for example.

Then, as shown in FIG. 2, diameter reduction working is carried out by the aforementioned method.

The structure shown in FIG. 2 is thereafter heat treated. The diameter reduction working and the heat treatment may be alternately repeated a plurality of times.

Thus, a desired superconducting wire is obtained. Examples of the present invention are now described in more concrete terms.

EXAMPLE 1

A bulk material of 4.5 mm in diameter prepared by a floating zone melting method and having composition of $Bi_2Sr_2Ca_1Cu_2O_x$, whose longitudinal direction was oriented perpendicularly to the c-axes, was charged in an Ag—10 wt. % Pd alloy pipe of 5 mm in inner diameter and 7 mm in outer diameter, and worked into a tape-type wire of 5 mm in width and 0.2 mm in thickness by swaging, wire drawing and rolling. Heat treatment was performed on this wire at 840° C. for 50 hours, to obtain a sample with a frequency of repetition of the aforementioned rolling and heat treatment of "one time". Thereafter the rolling and the heat treatment were alternately repeated, to obtain samples with frequencies of repetition of "two times" to "six times" respectively. As to the respective ones of these samples, sectional dimensions and critical current density values Jc in zero fields at the liquid nitrogen temperature were measured, to obtain the results shown in the following Table 1.

TABLE 1

| Frequency of Repetition | Sectional Dimension Density | Critical Current |
| --- | --- | --- |
| One Time | 5.0 mm Wide 0.2 mm Thick | 30000 A/cm² |
| Two Times | 5.5 mm Wide 0.18 mm Thick | 50000 A/cm² |
| Three Times | 5.8 mm Wide 0.16 mm Thick | 60000 A/cm² |
| Four Times | 6.0 mm Wide 0.15 mm Thick | 70000 A/cm² |
| Five Times | 6.2 mm Wide 0.14 mm Thick | 75000 A/cm² |
| Six Times | 6.3 mm Wide 0.13 mm Thick | 70000 A/cm² |

When powder having composition of $Bi_2Sr_2Ca_1Cu_2O_x$ was charged in the same silver alloy pipe as that employed in Example 1 and subjected to similar working and heat treatment as reference example, on the other hand, merely low Jc of 2000 A/cm² was obtained.

Apparent density of a superconductive material forming the core of the obtained superconducting wire was 99% in the former, while it was 80% in the latter.

Further, the structures of the sections were observed, and orientation was recognized over the entire region in the former, while orientation was disturbed in the central part of the core in the latter.

EXAMPLE 2

A sintered body of 4.5 mm in diameter prepared by sintering in magnetic field and having composition of $Y_1Ba_2Cu_3O_x$, whose longitudinal direction was oriented perpendicularly to the c-axes, was charged in a silver pipe of 5 mm in inner diameter and 6 mm in outer diameter, and worked into a tape-type wire of 4 mm in width and 0.1 mm in thickness by swaging, wire drawing and rolling. Heat treatment was performed on this wire in an oxygen flow at 940° C. for 12 hours and successively in the oxygen flow at 650° C. for 24 hours, to obtain a sample with a frequency of repetition of the aforementioned rolling and heat treatment of "one time". Thereafter the rolling and the heat treatment were alternately repeated a plurality of times, to obtain samples with frequencies of repetition of "two times" to "four times" respectively. As to the respective ones of the samples thus obtained, sectional dimensions and critical current density values Jc in zero fields at the liquid nitrogen temperature were measured, to obtain the results shown in the following Table 2.

TABLE 2

| Frequency of Repetition | Sectional Dimension | Critical Current Density |
| --- | --- | --- |
| One Time | 4.0 mm Wide 0.1 mm Thick | 15000 A/cm² |
| Two Times | 4.5 mm Wide 0.08 mm Thick | 25000 A/cm² |
| Three Times | 4.8 mm Wide 0.07 mm Thick | 30000 A/cm² |
| Four Times | 5.0 mm Wide 0.06 mm Thick | 28000 A/cm² |

When a superconductive material of the same composition was charged in the same silver pipe in a pulverulent state and subjected to similar treatment as reference example, critical current density of merely 1000 A/cm² was obtained.

EXAMPLE 3

A sintered body of 4 mm×2 mm in section prepared by a hot pressing method and having composition of $Bi_{0.7}Pb0.3Sr_1Ca_1Cu_{1.8}O_x$, whose longitudinal direction was oriented perpendicularly to the c-axes, was charged in a rectangular pipe of an Ag—20 wt. % Pd alloy, and worked into a tape-type wise of 6 mm in width and 0.1 mm in thickness by rolling and press working. Heat treatment was performed on this wire at 845° C. for 200 hours, to attain properties of Tc=110K and Jc=25000 A/cm².

Industrial Applicability

Thus, the superconducting wire obtained according to the present invention is effectively applied to a superconducting magnet or a superconducting cable, since the same has high critical current density.

We claim:

1. A method of producing a ceramics system superconducting wire, said method comprising the following steps:

preparing a bulk type ceramics system superconductor comprising a Bi—Sr—Ca—Cu—O system oxide or a Bi—Pb—Sr—Ca—Cu—O system oxide and having the longitudinal direction of said superconductor oriented perpendicularly to the c-axes of its crystals;

charging said superconductor into a metallic pipe;

performing diameter reduction working by deforming said metallic pipe into a tape-shaped wire and rolling said tape-shaped wire at a reduction rate of about 6.25% to 11.1%, thereby elongating said metallic pipe while causing separation of some said crystals and also causing some of said crystals to have their c-axis become non-perpendicular with the longitudinal direction of said superconductor; and heat treating said metallic pipe and said superconductor at a temperature of about 840° C., thereby combining crystals separated during the step of diameter reduction working, and alternately repeating the diameter reduction working and the heat treating steps so that the extent to which crystal orientation is lost is limited.

2. A method of producing a ceramics system superconducting wire, said method comprising the following steps:

preparing a precursor of a bulk type ceramics system superconductor comprising a Bi—Sr—Ca—Cu—O system oxide or a Bi—Pb—Sr—Ca—Cu—O system oxide and having the longitudinal direction of said superconductor oriented perpendicularly to the c-axes of its crystals;

charging said superconductor into a metallic pipe;

performing diameter reduction working by deforming said metallic pipe into a tape-shaped wire and rolling said tape-shaped wire at a reduction rate of about 6.25% to 11.1%, thereby elongating said metallic pipe while causing separation of some crystals and also causing some of said crystals to have their c-axis become non-perpendicular with the longitudinal direction of said superconductor; and heat treating said metallic pipe and said superconductor at a temperature of about 840° C., thereby combining crystals separated during the step of diameter reduction working, and alternately repeating the diameter reduction working and the heat treating steps so that the extent to which crystal orientation is lost is limited.

3. A method of producing a ceramics system superconducting wire, said method comprising the following steps:

preparing a bulk type ceramics system superconductor comprising a Y—Ba—Cu—O system oxide and having the longitudinal direction of said superconductor oriented perpendicularly to the c-axes of its crystals;

charging said superconductor into a metallic pipe;

performing diameter reduction working by deforming said metallic pipe into a tape-shaped wire and rolling said tape-shaped wire at a reduction rate of about 12.5% to 20.0%, thereby elongating said metallic pipe while causing separation of some of said crystals and also causing some of said crystals to have their c-axis become non-perpendicular with the longitudinal direction of said superconductor; and heat treating said metallic pipe and said superconductor at temperatures of 940° C. and 650° C. successively, thereby combining crystals separated during the step of diameter reduction working, and alternately repeating the diameter reduction working and the heat treating steps so that the extent to which crystal orientation is lost is limited.

4. A method of producing a ceramics system superconducting wire, said method comprising the following steps:

preparing a precursor of a bulk type ceramics system superconductor comprising a Y—Ba—Cu—O system oxide and having the longitudinal direction of said superconductor oriented perpendicularly to the c-axes of its crystals;

charging said superconductor into a metallic pipe;

performing diameter reduction working by deforming said metallic pipe into a tape-shaped wire and rolling said tape-shaped wire at a reduction rate of about 12.5% to 20.0%, thereby elongating said metallic pipe while causing separation of some said crystals and also causing some of said crystals to have their c-axis become non-perpendicular with the longitudinal direction of said superconductor; and heat treating said metallic pipe at temperatures of 940° C. and 650° C. successively thereby combining crystals separated during the step of diameter reduction working, and alternately repeating the diameter reduction working and the heat treating steps so that the extent to which crystal orientation is lost is limited.

5. The method of producing a superconducting wire in accordance with any one of claims 1–4, wherein said preparing step includes a step of melting and solidifying a raw material for said superconductor.

6. The method of producing a superconducting wire in accordance with claim 5, wherein said melting and solidifying step unidirectionally solidifies said raw material.

7. The method of producing a superconducting wire in accordance with any one of claims 1–4, wherein said metallic pipe is made of silver or a silver alloy.

8. The method of producing a superconducting wire in accordance with claim 7, wherein said silver alloy is an Ag—3 to 30 wt. % Pd alloy.

9. The method of producing a superconducting wire in accordance with one of claims 1–4, wherein said diameter reduction working step and said heat treatment step are alternately repeated from two to five times.

\* \* \* \* \*